United States Patent

Lee

[11] Patent Number: 5,901,190
[45] Date of Patent: May 4, 1999

[54] DIGITAL DELAY LOCKED LOOP CIRCUIT USING SYNCHRONOUS DELAY LINE

[75] Inventor: Seung-Hun Lee, Suwon, Rep. of Korea

[73] Assignee: Samsung Electronics, Co., Ltd., Suwon, Rep. of Korea

[21] Appl. No.: 08/771,538

[22] Filed: Dec. 23, 1996

[30] Foreign Application Priority Data

Dec. 27, 1995 [KR] Rep. of Korea ......... 95-59445

[51] Int. Cl.$^6$ ................................. H03K 5/14
[52] U.S. Cl. ............... 375/373; 375/376; 327/161; 327/158; 331/25; 370/58
[58] Field of Search ............... 375/376, 373, 375/371, 359; 327/161, 159, 158, 153, 152, 141, 284, 277, 261, 116; 370/518, 517, 516; 331/25, 1 R, 1 A

[56] References Cited

U.S. PATENT DOCUMENTS

| | | | |
|---|---|---|---|
| 5,287,025 | 2/1994 | Nishimichi | 327/156 |
| 5,295,164 | 3/1994 | Yamamura | 375/376 |
| 5,463,337 | 10/1995 | Leonowich | 327/158 |
| 5,669,003 | 9/1997 | Saeki | 327/261 |
| 5,708,382 | 1/1998 | Park | 327/277 |

*Primary Examiner*—Stephen Chin
*Assistant Examiner*—Betsy L. Deppe
*Attorney, Agent, or Firm*—Marger Johnson & McCollom P.C.

[57] ABSTRACT

A digital locked loop circuit having a synchronous delay line, an input node for receiving an external clock signal, and an internal clock node for generating an internal clock signal synchronized with the external clock signal. The digital locked loop circuit includes; a delay buffer for generating a first clock signal by delaying the external clock signal by a predetermined time; a main delay for generating a second clock signal by delaying the first clock signal by a predetermined time; a first delay line consisting of a plurality of serially connected first unit delays, each of the plurality of first unit delays generating a first unit delay output signal by delaying the second clock signal by a predetermined unit length; a second delay line consisting of a plurality of serially connected second unit delays, each of the plurality of second unit delays generating a second unit delay output signal by delaying the first clock signal by a predetermined unit length; switching means for coupling the first clock signal to the internal clock node in response to an enable signal, the switching means having a plurality of switches, each of the plurality of switches connected between an output node of a corresponding second unit delay of the second delay line and the internal clock node; and phase comparing means for generating the enable signal for a predetermined switch of the plurality of switches when the first clock signal is in phase with at least one first unit delay output signal, the phase comparing means being connected between an output node of a first unit delay and an enable port of a corresponding switch of the plurality of switches of the switching means.

20 Claims, 5 Drawing Sheets

DIGITAL DELAY LOCKED LOOP CIRCUIT USING SYNCHRONOUS DELAY LINE

BACKGROUND OF THE INVENTION

1. Field of the Invention

The present invention relates to clock synchronizing circuits and, more particularly, to a digital delay locked loop circuit for synchronizing an internal clock to an external system clock in a synchronous semiconductor memory device.

The present application is based on Korean Application No. 59445/1995 which is incorporated herein by reference for all purposes.

2. Description of the Related Art

Conventionally, a synchronous semiconductor memory device includes an external system clock signal CLK and a clock buffer circuit for generating internal clock signal PCLK. Internal clock PCLK is supplied to each circuit of the semiconductor memory device. The clock buffer circuit simply buffers external system clock CLK to produce internal clock PCLK. Inevitably, a phase difference between external system clock CLK and internal clock PCLK is created.

The phase difference between external system clock CLK and internal clock PCLK results in a corresponding response delay in the semiconductor memory device. Accordingly, a need remains for a semiconductor memory device having an internal clock synchronized with an external system clock CLK to thereby eliminate undue delay.

A variety of approaches have been taken to solve this problem. One approach developed to minimize the phase difference between external system clock CLK and internal clock PCLK involves using a phase locked loop (PLL) circuit. A second approach involves using a delay locked loop (DLL) circuit.

The operation of a PLL synchronizing circuit will be explained below with reference to FIG. 1. The PLL circuit shown in FIG. 1 comprises a phase detector 12, a loop filter 14, and a voltage controlled oscillator 16. When external system clock CLK and internal clock PCLK are applied to phase detector 12, it detects the phase difference and supplies a phase difference detection signal to loop filter 14. Loop filter 14 is a low-pass filter which generates a direct current control voltage V(t) by filtering the phase difference detection signal. Loop filter 14 supplies control voltage V(t) to voltage controlled oscillator 16 connected, in turn, to the output port. Voltage controlled oscillator 16 generates internal clock PCLK having a frequency corresponding to the level of control voltage V(t) output from loop filter 14.

Consequently, if the phase difference between external system clock CLK and internal clock PCLK has a positive value, control voltage V(t) is increased. By doing so, the cycle of internal clock PCLK output from voltage controlled oscillator 16 is reduced, and thus the phase difference between external system clock CLK and internal clock PCLK is reduced. On the other hand, if the phase difference between the external clock CLK and internal clock PCLK has a negative value, control voltage V(t) is decreased resulting in an increase in the cycle of internal clock PCLK output from voltage controlled oscillator 16 and a decrease in the phase difference between external system clock CLK and internal clock PCLK.

The operation of a DLL synchronizing circuit is similar to that described above. In the case of a DLL circuit, voltage controlled oscillator 16 is replaced by a voltage controlled delay circuit. The delay produced by the voltage controlled delay circuit varies according to control voltage V(t).

PLL and DLL synchronizing circuits have several disadvantages. The locking time, i.e., the time required to synchronize the internal clock PCLK with the external system clock CLK, is long. Increased locking time results in increased data access time, and thus, slower acquisition times. Additionally, the synchronizing circuit must be operated at all times and during all device states, including standby, increasing the standby current and the consequent power consumption.

SUMMARY OF THE INVENTION

An object of the present invention is to provide a digital delay locked loop circuit employing a synchronous delay line (SDL) which generates an internal clock signal synchronized with an external system clock signal.

Another object of the present invention is to provide a digital delay locked loop circuit employing an SDL which minimizes the phase difference between an external system clock signal and an internal clock signal by comparing a first clock signal which is not delayed to a second internal clock signal delayed by a predetermined time.

To accomplish the objects of the present invention, there is provided a digital locked loop circuit having a synchronous delay line, an input node for receiving an external clock signal, and an internal clock node for generating an internal clock signal synchronized with the external clock signal, said circuit comprising: a delay buffer for generating a first clock signal by delaying the external clock signal by a predetermined time; a main delay for generating a second clock signal by delaying the first clock signal by a predetermined time; a first delay line consisting of a plurality of serially connected first unit delays, each of the plurality of first unit delays generating a first unit delay output signal by delaying the second clock signal by a predetermined unit length; a second delay line consisting of a plurality of serially connected second unit delays, each of the plurality of second unit delays generating a second unit delay output signal by delaying the first clock signal by a predetermined unit length; switching means for coupling the first clock signal to the internal clock node in response to an enable signal, said switching means having a plurality of switches, each of the plurality of switches connected between an output node of a corresponding second unit delay of said second delay line and the internal clock node; and phase comparing means for generating the enable signal for a predetermined switch of the plurality of switches when the first clock signal is in phase with at least one first unit delay output signal, said phase comparing means being connected between an output node of a first unit delay and an enable port of a corresponding switch of the plurality of switches of said switching means.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, wherein.

DETAILED DESCRIPTION OF THE PREFERRED EMBODIMENT

Figure 1:
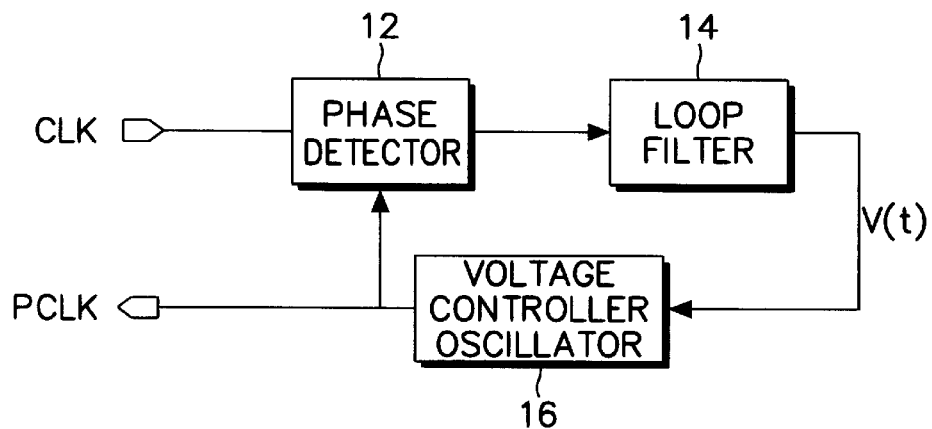
FIG. 1 is a block diagram of conventional clock synchronizing circuit using a phase locked loop.
Figure 2:
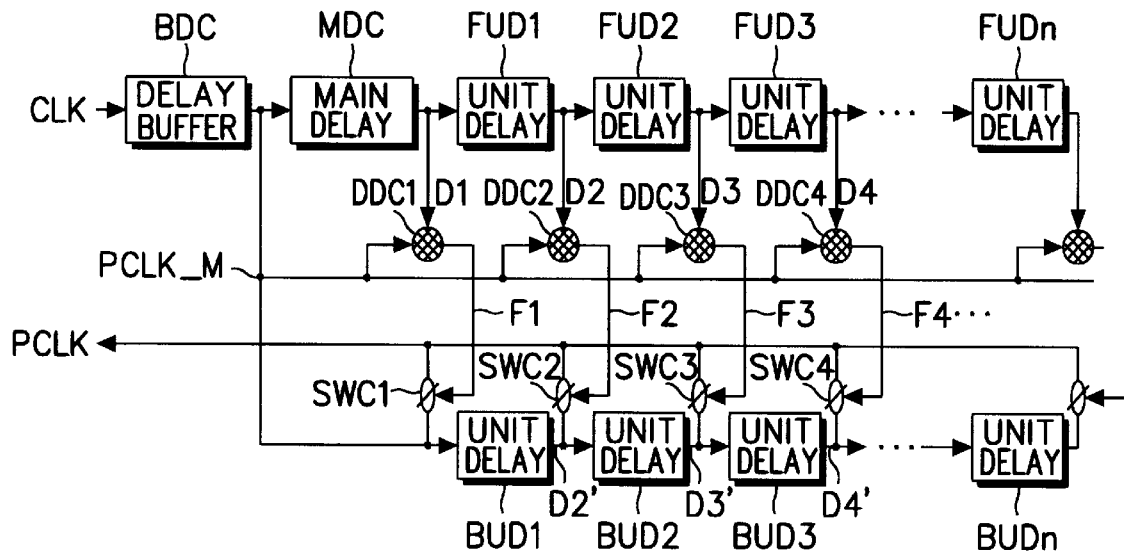
FIG. 2 is a block diagram of a digital delay locked loop circuit using a synchronous delay line according to the present invention.

FIG. 2 is a block diagram of a digital delay locked loop (DLL) circuit using a synchronous delay line (SDL) according to the present invention. The DLL circuit comprises delay buffer BDC, a main delay circuit MDC, a first plurality of unit delays FUD1 to FUDn, a second plurality of unit delays BUD1 to BUDn, a plurality of switches SWC1 to SWCn, and a plurality of delay detectors DDC1 to DDCn. Delay buffer BDC generates first delayed clock PCLK_M by delaying external clock CLK by a predetermined time. First clock PCLK_M is applied to the input node of main delay circuit MDC, to the input node of each of a plurality of delay detectors DDC1 to DDCn, and to the input node of each of the plurality of second unit delays. A plurality of first unit delays FUD1 to FUDn, each having identical delay length, are serially connected to each other and to the output node of main delay MDC. Unit delays FUD1 to FUDn generate clocks D2 to Dn. Each of clocks D2 to Dn are time delayed from second clock D1. Second clock D1, in turn, is time delayed from first clock PCLK_M and output from main delay MDC.

The second delay line comprises a serially connected second plurality of unit delays BUD1 to BUDn. Each of unit delays BUD1 to BUDn have the same delay length as that of unit delays FUD1 to FUDn. Each of switches SWC1 to SWCn is connected between internal clock PCLK and a corresponding one of a second plurality of unit delays BUD1 to BUDn. Switches SWC1 to SWCn select at least one of first clock PCLK_M and clock Di' (i denotes a natural number) delayed by a corresponding unit delay BUD1 to BUDn. Switches SWC1 to SWCn supply the selected clock signal to the output node of internal clock signal PCLK. Each of switches SWC1 to SWCn are enabled by a corresponding enable signal Fi output, in turn, by a corresponding one of a plurality of phase detectors DDC1 to DDCn. Each of phase detectors DDC1 to DDCn receives first clock PCLK_M and delayed clock Di output from unit delays FUD1 to FUDn. Each of phase detectors DDC1 to DDCn compares the phase of first clock PCLK_M and a corresponding delayed clock Di, latching delayed clock Di when first clock PCLK_M and clock Di are in phase, and activating the switch enable signal when first clock PCLK_M is in a logic low state.

Figure 3:
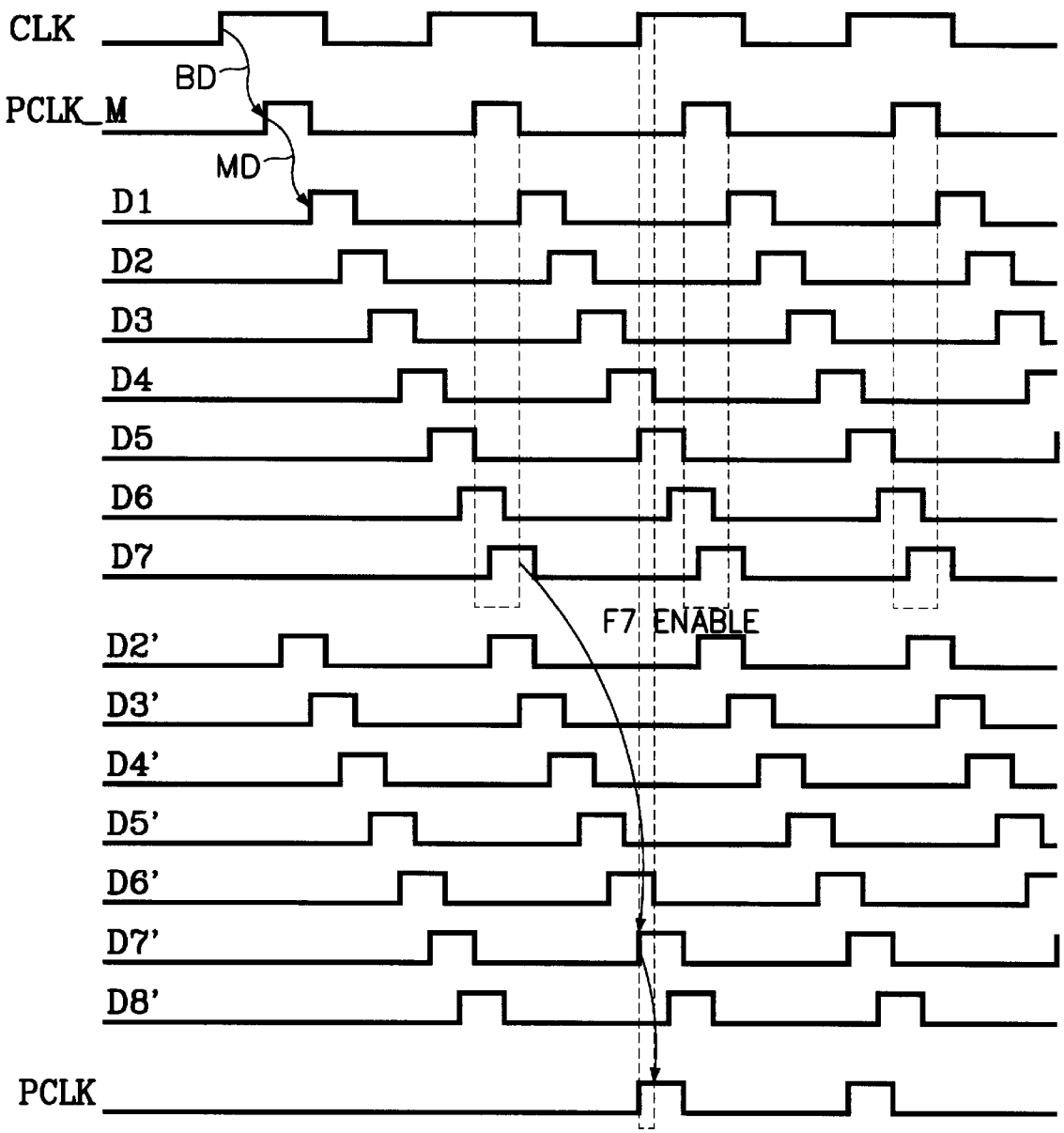
FIG. 3 is a timing diagram for the purpose of explaining the operation of the digital delay locked loop circuit of FIG. 2.

The operation of the digital locked loop circuit of FIG. 2 will be explained with reference to FIG. 3. External clock signal CLK is input to buffer delay circuit BDC as shown in FIG. 3. Buffer delay circuit BDC generates first clock signal PCLK_M. First clock PCLK_M is delayed by main delay circuit MDC to be thereby output as second clock D1. Main delay circuit MDC and buffer delay circuit BDC have similar delay lengths. First clock PCLK_M is supplied to a first input node of each of a plurality of delay detectors DDC1 to DDCn and, at the same time, applied to unit delay BUD1.

Second clock D1 is sequentially delayed by a plurality of serially connected unit delays FUD1 to FUDn thereby generating delay clocks D2 to Dn as shown in FIG. 3. Each of the plurality of unit delays FUD1 to FUDn have identical delay lengths. Second clock Di output from main delay MDC and sequentially delayed clocks D2 to Dn are applied to an input node of a corresponding one of delay detectors DDC1 to DDCn.

Delay detector DDC1 compares the phase of first clock PCLK_M with the phase of second clock D1. Similarly, delay detectors DDC2 to DDCn compare the phase of first clock PCLK_M with the phase of corresponding delayed clocks D2 to Dn. Each of the plurality of delay detectors DDC1 to DDCn receives first clock PCLK_M and a corresponding delayed clock D1 to Dn. Delay detectors DDC1 to DDCn activate a enable signal F1 to Fn having the cycle of the corresponding delayed clock D1 to Dn which is applied when first clock PCLK_M and delayed clocks D1 to Dn are in phase.

For example, if first clock PCLK_M and delayed clock D7 output from unit delay FUD7 are in phase as shown in FIG. 3, delay detector DDC7 latches and outputs delayed clock D7 when first clock PCLK_M is in a logic low state. Thus, delay detector DDC7 activates output signal F7, turning on switch SWC7. Consequently, clock D7', which is sequentially delayed by unit delays BUD1 to BUD7, is connected to the output node of internal clock PCLK. Thus, the output of delay detector DDC7 selects delayed clock D7' of unit delay BUD7 and connects it to the output node of internal clock PCLK without having to apply first clock PCLK_M to main delay circuit MDC.

Generating internal clock PCLK in the aforementioned manner results in internal clock PCLK being faster than first clock PCLK_M by the length of delay of main delay circuit MDC. If the delay of main delay circuit MDC and delay buffer BDC are the same, there is no delay between external clock CLK and internal clock PCLK. That is, internal clock PCLK will be in phase with external clock CLK. In the circuit of FIG. 2, it would take three clock cycles to synchronize the phases of external clock CLK and internal clock PCLK minimizing both acquisition time and power consumption during standby.

Figure 4:
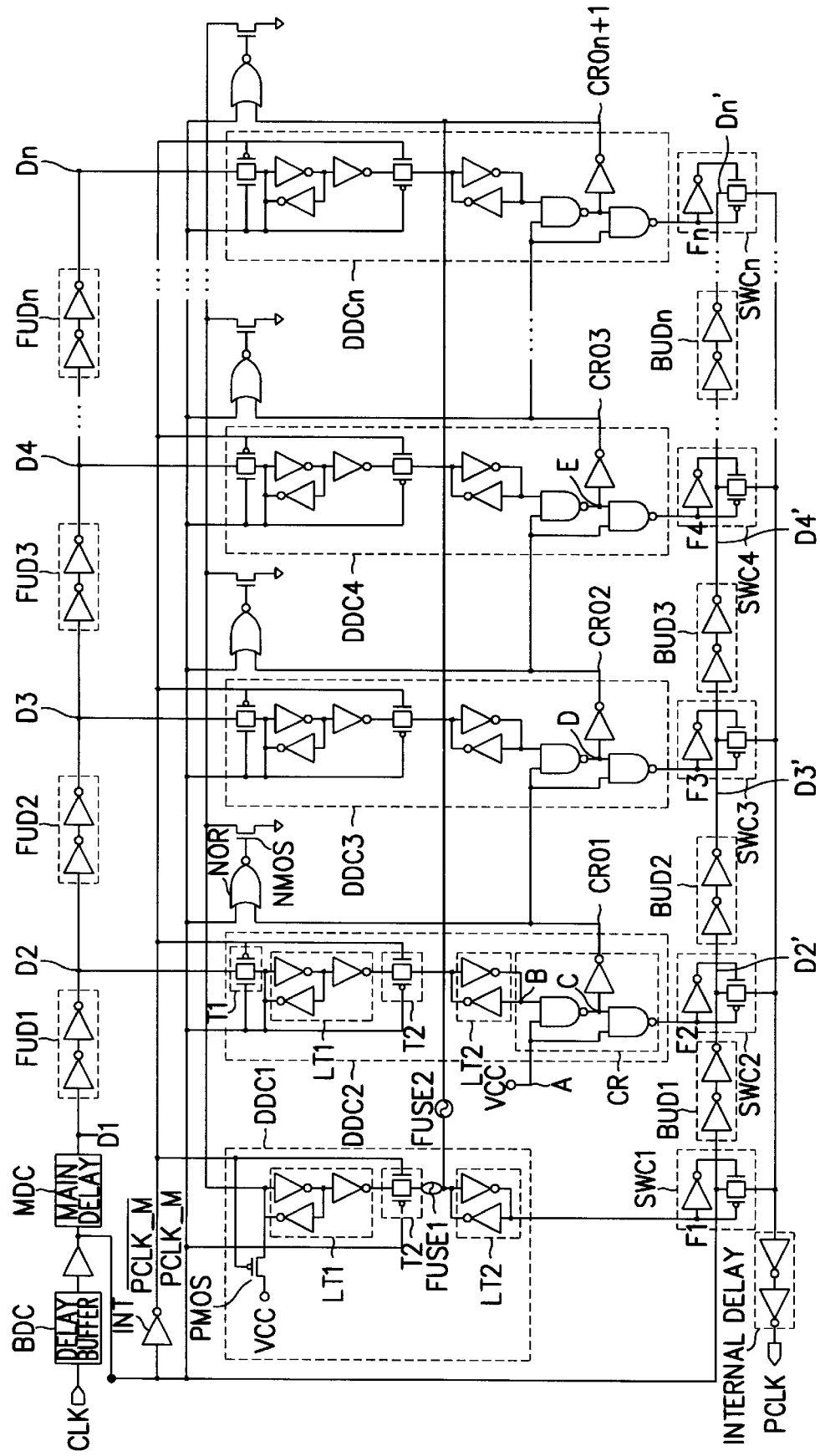
FIG. 4 is a circuit diagram of the digital delay locked loop circuit according to the present invention.
Figure 5:
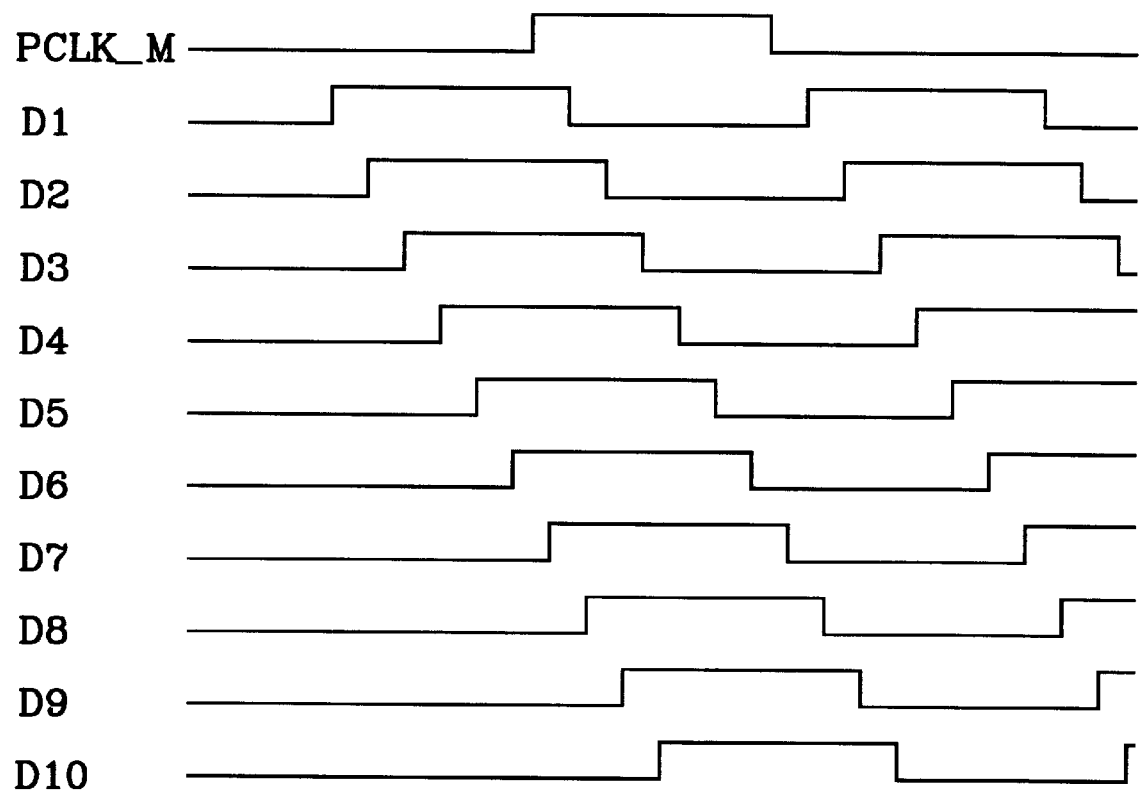
FIG. 5 is a timing diagram for the purpose of explaining the operation of the synchronous delay line of FIG. 4.

FIG. 4 shows the interconnection of a plurality of unit delays FUD1 to FUDn and BUD1 to BUDn, a plurality of switches SWC1 to SWCn, and plurality of delay detectors DDC1 to DDCn. FIG. 5 is a timing diagram for the purpose of explaining the operation of the synchronous delay line of FIG. 4, and shows the output timing relation between first clock PCLK_M and the plurality of unit delays FUD1 to FUDn.

In the digital DLL circuit of FIG. 2, delay buffer BDC delays external clock CLK for a predetermined time, generating first clock PCLK_M as shown in FIG. 5. Thereafter, first clock PCLK_M is sequentially delayed by a plurality of serially connected unit delays BUD1 to BUDn comprising the second delay line. Unit delays BUD1 to BUDn, in turn, generate clocks D1' to Dn'. Delayed clocks D1' to Dn' are faster than the corresponding delayed clocks D1 to Dn by the length of delay of main delay circuit MDC because, as can be seen in FIG. 4, delayed clocks D1' to Dn' are not applied to main delay circuit. Delayed clocks D1' to Dn' are not output as internal clock PCLK unless switches SWC1 to SWCn connected between the output nodes of the delay detectors and the node of internal clock CLK_M are turned on.

Second clock D1 is sequentially delayed through the serially connected delay line of unit delays FUD1 to FUDn each of which consists of two serially connected inverters as shown in FIG. 5. Unit delays FUD2 to FUDn supply clocks D2 to Dn to a corresponding transfer gate located in delay detector DDC2 to DDCn. Second clock D1 is not supplied to a transfer gate.

Since delay detectors DDC2 to DDCn are constructed identically, only the operation and design of delay detector DDC2 will be described. Transfer gate T1 consists of a PMOS transistor and an NMOS transistor. The gate of the NMOS transistor is connected to first clock PCLK_M, and the gate of the PMOS transistor is connected to the output node of an inverter INT which inverts first clock PCLK_M. The output node of transfer gate T1 in delay detector DDC2 is connected to the input node of a first latch circuit LT1 which latches and inverts a signal applied thereto. Accordingly, when first clock PCLK_M is in a logic high state, delayed clock D2 output from unit delay FUD1 is latched and output from latch circuit LT1.

The output node of first latch circuit LT1 is connected to a transfer gate T2 which is enabled when first clock PCLK_M is in a logic low state. The output node of transfer gate T2 is connected to a second latch circuit LT2 which latches the signal output from transfer gate T2. The output node of second latch circuit LT2 is connected to input node B of a carry generator CR connected to the control port of a corresponding switch, switch SWC2 in the case of delay detector DDC2. Carry generator CR activates an enable signal output from node F2, and at the same time, disables carry output port CRO1 when carry input port A and input node B are in logic low and high states, respectively. Carry output port CROi is connected to a first input node of a NOR gate NOR. The second input node of gate NOR is connected to first clock PCLK_M. Carry output port CROi is also connected to port A of carry generator CR of the next stage delay detector. When a phase lock operation is performed in delay detector DDC2, as shown in FIG. 2, carry output port CRO1 changes to a logic low state from a logic high level resulting in a logic high state at node D of the next state delay detector. Thus, switch SWC3 receives a logic high F3 signal to thereby be turned off and simultaneously, places a logic low signal at carry output port CRO2.

Table 1 is a truth table of the operation of the circuit shown in FIG. 4.

TABLE 1

| carry input port A | clock input port B | carry output port CROi | output port F (Vss = enable) |
|---|---|---|---|
| Vss | Vss | Vss | Vcc |
| Vss | Vcc | Vss | Vcc |
| Vcc | Vss | Vss | Vss |
| Vcc | Vcc | Vcc | Vcc |

Accordingly, each of delay detectors DDC2 to DDCn latches a corresponding delayed clock D2 to Dn output from unit delays FUD2 to FUDn when first clock PCLK_M is in a logic high state and outputs a corresponding enable signal Fi. Enable signal Fi, in turn, connects the selected delayed clock D1' to Dn', delayed by unit delays BUD1 to BUDn, to internal clock PCLK when the selected delayed clock D1' to Dn' is in a logic high and first clock PCLK_M is in a logic low. Thus, if enable signal Fi is activated, enable signals Fi+1, Fi+2, ..., and Fi+n are disabled by the connection of carry generator CR.

First delay detector DDC1 includes a user operable mode selecting means. For example, if the clock cycle of external clock CLK is longer than the delay length on the first and second delay lines, comprised of unit delays FUD1 to FUDn and BUD1 to BUDn, respectively, the operation of delay detector DDC1 can be determined by the user connecting or disconnecting fuses FUSE1 and FUSE2. Fuses FUSE1 and FUSE2 are typically open when the cycle of external clock CLK is shorter than the delay length of the first and second delay lines, and shorted when the cycle of external clock CLK is longer than the delay length of the first and second delay lines.

When fuses FUSE1 and FUSE2 are shorted, the input operation of external clock signal CLK whose cycle is longer than the delay length of the first and second delay lines is carried out in the following manner. When first clock PCLK_M is in a logic low, gate NOR generates a logic high signal which is input to NMOS transistor NMOS. Transistor NMOS turns on initializing first latch circuit LT1 in delay detector DDC1. Thereafter, when first clock PCLK_M changes to a logic high, PMOS transistor PMOS turns on responsive to the output of inverter INT. By doing so, the output of first latch circuit LT1 changes to a logic high. When first clock PCLK_M changes to a logic low, transfer gate T2 transmits the output of first latch circuit LT1 to second latch circuit LT2 which latches its input, to thereby turn on switch SWC1. The result is first clock PCLK_M being directly connected to internal clock PCLK when external system clock CLK has a clock cycle longer than the delay length of first or second delay lines.

Figure 6:
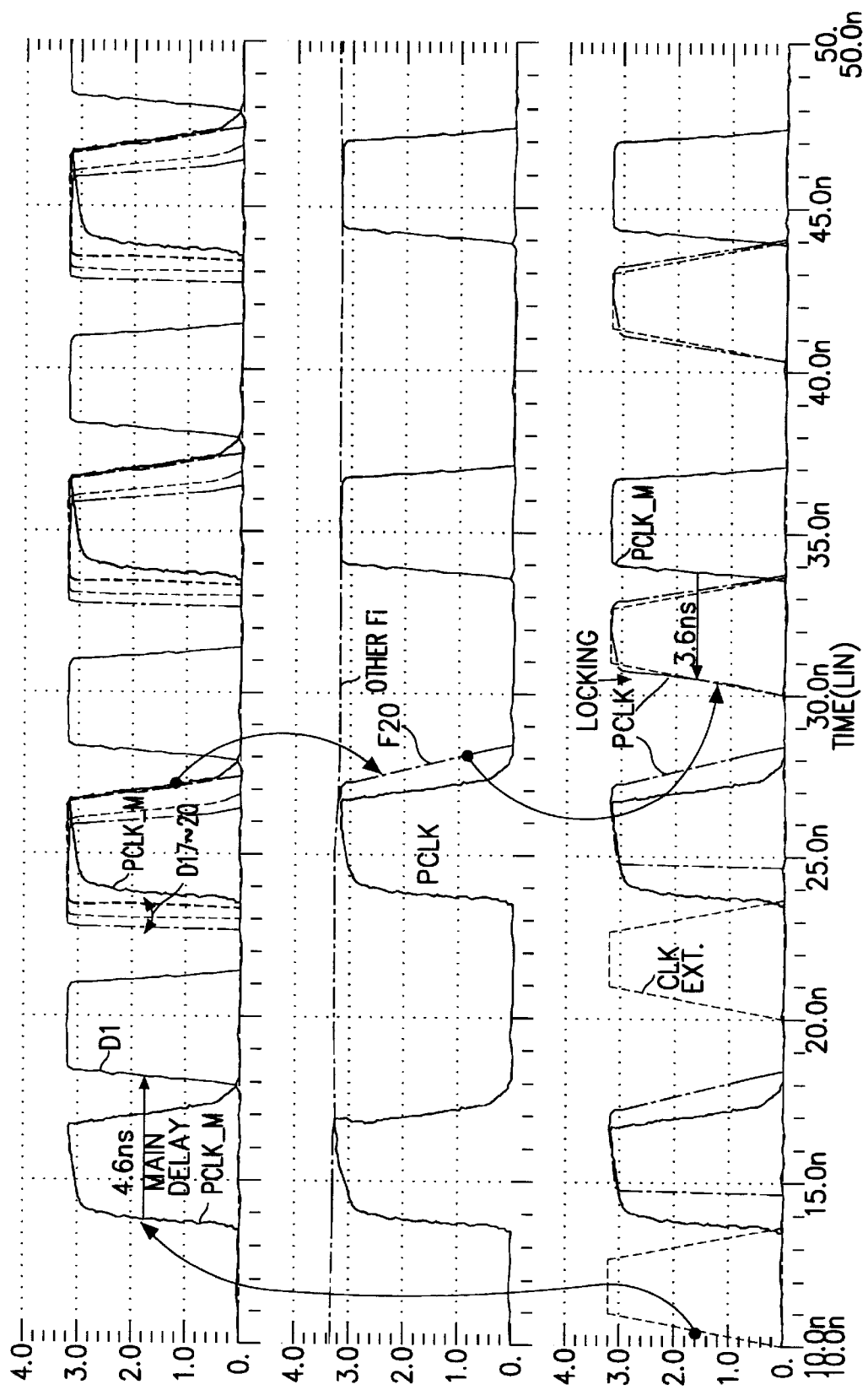
FIG. 6 is a waveform diagram showing the result of a simulation of the digital delay locked loop circuit using a synchronous delay line according to the present invention.

FIG. 6 shows a timing diagram of an embodiment of the present invention. When F20 is at a logic low, D20' is outputted to PCLK due to the correspondence of D20 with PCLK_M.

As described above, the present invention minimizes the phase difference between the external clock and internal clock by comparing a first clock PCLK_M delayed by a predetermined time using a synchronous delay line with an internal clock PCLK which is not delayed. The present invention reduces SDRAM access time by synchronizing an internal clock with an external system clock using a minimum number of external clock cycles.

While the above description provides a full and complete disclosure of the preferred embodiments of the invention, various modifications, alternate constructions and equivalents may be employed as desired. Therefore, the above description and illustrations should not be construed as limiting the invention. I claim all modifications and variations coming within the spirit and scope of the following claims.

What is claimed is:

1. A digital locked loop circuit having a synchronous delay line, an input node for receiving an external clock signal, and an internal clock node for generating an internal clock signal synchronized with the external clock signal, said circuit comprising:

a delay buffer for generating a first clock signal by delaying the external clock signal by a first predetermined time;

a main delay for generating a second clock signal by delaying the first clock signal by a second predetermined time;

a first delay line having a plurality of serially connected first unit delays, each of the plurality of first unit delays having an input and an output terminal, a first first unit delay being connected to receive the second clock signal at its input terminal and each of the first unit delays providing at its respective output terminal a corresponding first unit delay output signal responsive to the signal at its respective input terminal;

a second delay line having a plurality of serially connected second unit delays, each of the plurality of second unit delays having an input and an output terminal, a first second unit delay being connected to receive the first clock signal at its input terminal and each of the second unit delays providing at its respective output terminal a second unit delay output signal responsive to the signal at its respective input terminal;

switching means for coupling the first clock signal to the internal clock node in response to an enable signal, said switching means having a plurality of switches, each of the plurality of switches connected between an output node of a corresponding second unit delay of said second delay line and the internal clock node; and phase comparing means for generating the enable signal for a predetermined switch of the plurality of switches when the first clock signal is in phase with at least one first unit delay output signal, said phase comparing means being connected between an output node of first unit delay and an enable port of a corresponding switch of the plurality of switches of said switching means.

2. The digital locked loop circuit of claim 1 wherein said phase comparing means comprises:

means for latching a first unit delay output signal when the first clock signal is in a first logic state; and means for activating at least one switch of the plurality of switches of said switching means when the first clock signal is in a second logic state.

3. The digital locked loop circuit of claim 2, wherein said means for activating comprises means for preventing a means for activating of a next stage from generating the enable signal.

4. The digital locked loop circuit of claim 1 further comprising means for bypassing said first clock signal to said internal clock node when the clock cycle of the external clock signal is longer than a delay time on said first delay line.

5. A digital circuit for synchronizing an internal clock signal to an external clock signal in a semiconductor memory device, the digital circuit comprising:

a first delay for generating a first clock signal by delaying the external clock signal by a first predetermined time;

a second delay for generating a second clock signal by delaying the first clock signal by a second predetermined time;

a plurality of serially connected first unit delays, each first unit delay of said plurality of first unit delays having an input and an output terminal, a first first unit delay being connected to receive the second clock signal at its input terminal and each first unit delay providing at its respective output terminal a corresponding first unit delay output signal responsive to the signal at its respective input terminal;

means for determining phase equivalence between the first clock signal and at least one of the delayed second clock signals output from each of the unit delays of said first plurality of serially connected unit delays; and a plurality of serially connected second unit delays coupled to said means for determining phase equivalence, each second unit delay of said plurality of second unit delays having an input and an output terminal, a first second unit delay being connected to receive at its input terminal the first clock signal second unit delay providing at its respective output terminal a corresponding second unit delay output signal responsive to the signal at its respective input terminal.

6. The digital circuit for synchronizing an internal clock signal to an external clock signal of claim 5 further comprising:

a plurality of switches responsive to an enable signal for coupling the signal provided to the output terminal of at least one of the second unit delays of the plurality of second unit delays to an internal clock signal node.

7. The digital circuit for synchronizing an internal clock signal to an external clock signal of claim 6 wherein said means for determining phase equivalence is connected between said plurality of serially connected first unit delays and said plurality of switches, said means for determining phase equivalence generating the enable signal to at least one of said plurality of switches.

8. The digital circuit for synchronizing an internal clock signal to an external clock signal of claim 7 wherein said means for determining phase equivalence comprises a plurality of delay detectors, each delay detector connected between a corresponding first unit delay of said plurality of serially connected first unit delays and a corresponding switch of said plurality of switches.

9. The digital circuit for synchronizing an internal clock signal to an external clock signal of claim 8 wherein each delay detector further comprises:

a transmission gate having an input terminal and an output terminal, the input terminal of the transmission gate coupled to the output terminal of one of the first unit delays for transmitting the signal provided to the output terminal of the first unit delay to the output terminal of the transmission gate;

a latch circuit for latching and inverting the signal provided to the output terminals of the transmission gate when the first clock signal is in a first logic state, said first latch circuit coupled to said transmission gate; and a carry generator for generating the enable signal when the first clock signal is in a second logic state.

10. The digital circuit for synchronizing an internal clock signal to an external clock signal of claim 9 wherein said carry generator has an output coupled to an input of carry generator of a next stage delay detector.

11. The digital circuit for synchronizing an internal clock signal to an external clock signal of claim 7 wherein each first and second unit delay includes two serially connected inverters.

12. The digital circuit for synchronizing an internal clock signal to an external clock signal of claim 7 further comprising means for bypassing the first clock signal to the internal clock signal node when the clock cycle of the external clock signal is longer than the time delay of said first plurality of serially connected unit delays.

13. The digital circuit for synchronizing an internal clock signal to an external clock signal of claim 12 wherein said means for bypassing includes two fuses.

14. A method for synchronizing an internal clock signal to an external clock signal in a semiconductor memory device, the method comprising:

delaying an external clock signal by a predetermined first and second delay to generate a first and second clock signals, respectively;

generating a plurality of delayed second clock signals by delaying the second clock signal by a plurality of first unit delays;

generating a plurality of delayed first clock signals by delaying the first clock signal by a plurality of second unit delays; and comparing a clock phase of the first clock signal with each of the plurality of delayed second clock signals to determine at least one delayed second clock signal having a clock phase equivalent to the clock phase of the first clock.

15. The method of claim 14 further comprising the step of enabling at least one of a plurality of switches connected between the at least one delayed second clock signal having a clock phase equivalent to a phase of the first clock and a corresponding delayed first clock signal.

16. The method of claim 15 further comprising the step of coupling the delayed first clock signal corresponding to the at least one delayed second clock signal having a clock phase equivalent to a phase of the first clock to the internal clock signal.

17. The method of claim 16 further comprising the step of bypassing the first clock to the internal clock signal when the clock phase of the external clock signal is longer than a delay time of the first plurality of unit delays.

18. The method of claim 17 wherein the step of bypassing the first clock to the internal clock signal includes the step of closing two fuses.

19. The method of claim 16 wherein the step of comparing the clock phase of the first clock signal with each of the plurality of delayed second clock signals includes:

latching the first clock and each of the plurality of delayed second clocks when the first clock is in a first logic state; and generating an enable signal for at least one of the plurality of switches when the first clock is in a second logic state.

20. The method of claim 16 wherein the step of enabling at least one of a plurality of switches includes disabling the remaining plurality of switches.

* * * * *

UNITED STATES PATENT AND TRADEMARK OFFICE
CERTIFICATE OF CORRECTION

PATENT NO. : 5,901,190 Page 1 of 1
APPLICATION NO. : 08/771538
DATED : May 4, 1999
INVENTOR(S) : Lee It is certified that error appears in the above-identified patent and that said Letters Patent is hereby corrected as shown below:

In the abstract, Lines 19,21,26,29: "the" should read --said--.

Column 4, Line 5: "Di" should read --D1--.

Column 5, Line 31: "CROI" should read --CRO1--.

Signed and Sealed this

Fifth Day of June, 2007

JON W. DUDAS
*Director of the United States Patent and Trademark Office*